United States Patent
Djelassi (10) Patent No.: US 10,579,744 B2
(45) Date of Patent: Mar. 3, 2020

(54) METHOD AND SYSTEM FOR RESETTING A DIGITAL MODEL

(71) Applicant: SAFRAN AIRCRAFT ENGINES, Paris (FR)

(72) Inventor: Cedrik Djelassi, Marolles en Hurepoix (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 566 days.

(21) Appl. No.: 14/898,902

(22) PCT Filed: Jun. 11, 2014

(86) PCT No.: PCT/FR2014/051409
§ 371 (c)(1),
(2) Date: Dec. 16, 2015

(87) PCT Pub. No.: WO2014/202867
PCT Pub. Date: Dec. 24, 2014

(65) Prior Publication Data
US 2016/0314222 A1 Oct. 27, 2016

(30) Foreign Application Priority Data

Jun. 18, 2013 (FR) ...................................... 13 55712

(51) Int. Cl.
*G06F 17/50* (2006.01)
*G06F 9/445* (2018.01)
(52) U.S. Cl.
CPC .......... *G06F 17/50* (2013.01); *G06F 9/44505* (2013.01)

(58) Field of Classification Search
CPC ...... G06F 17/50; G06F 9/44505; G05B 17/02
See application file for complete search history.

(56) References Cited

U.S. PATENT DOCUMENTS

| 5,080,496 | A  | * | 1/1992 | Keim | ....................... | F02C 9/28 |
| | | | | | | 374/144 |
| 7,886,523 | B1 | * | 2/2011 | Legare | .................. | F02D 41/008 |
| | | | | | | 60/274 |

(Continued)

FOREIGN PATENT DOCUMENTS

WO    2010 067009    6/2010

OTHER PUBLICATIONS

Alexandru Nicolae Tudosie, Turbo-Jet Engine's Rotation Speed Control System With Fuel Flow Rate Injection Controller, International Conference on Electromechanical and Power Systems Oct. 4-6, 2007, p. 105-110 (Year: 2007).*

(Continued)

*Primary Examiner* — Rehana Perveen
*Assistant Examiner* — Chuen-Meei Gan
(74) *Attorney, Agent, or Firm* — Oblon, McClelland, Maier & Neustadt, L.L.P.

(57) ABSTRACT

Resetting a basic digital model includes a step of detecting a stable state of at least one first parameter of the model, the first parameter being representative of a signal delivered by a sensor; a step of obtaining a resetting parameter for the model, during the stable state of the first parameter as a function of the first parameter, of a second parameter of the model, and of the basic digital model; and a step of obtaining a reset model from the basic digital model and the resetting parameter.

11 Claims, 8 Drawing Sheets

(56) References Cited

U.S. PATENT DOCUMENTS

| | | | | |
|---|---|---|---|---|
| 2004/0073413 A1* | 4/2004 | Aberg | ............... | G06F 9/44 |
| | | | | 703/2 |
| 2009/0055072 A1* | 2/2009 | He | ............... | F02D 41/0007 |
| | | | | 701/102 |
| 2011/0010076 A1* | 1/2011 | Heinkele | ............... | F02D 41/187 |
| | | | | 701/103 |
| 2011/0054704 A1* | 3/2011 | Karpman | ............... | F02C 9/28 |
| | | | | 700/282 |
| 2011/0238351 A1* | 9/2011 | Djelassi | ............... | G01K 7/42 |
| | | | | 702/99 |
| 2011/0271698 A1* | 11/2011 | Errington | ............... | B60H 1/3211 |
| | | | | 62/227 |
| 2012/0283849 A1* | 11/2012 | Kureemun | ............... | G01K 7/42 |
| | | | | 700/30 |

OTHER PUBLICATIONS

Wang, Junxi, Xiaojian Mao, Keqing Zhu, Junhua Song, and Bin Zhuo. "An intelligent diagnostic tool for electronically controlled diesel engine." Mechatronics 19, No. 6 (2009): 859-867. (Year: 2009).*

Jamil El Hadef, Guillaume Colin, Yann Chamaillard, Vincent Talon. Turbocharged SI Engine Models for Control. The 11th International Symposium on Advanced Vehicule Control—AVEC'12, Sep. 2012 (Year: 2012).*

International Search Report dated Oct. 16, 2014 in PCT/FR2014/051409 filed Jun. 11, 2014.

* cited by examiner

| Num | e1 | e2 | e3 | s1 | s2 | s3 |
|---|---|---|---|---|---|---|
| 1 | 0 | 0 | 0 | 0 | 0 | 0 |
| 2 | 0 | 0 | 1 | 3 | 3 | 3 |
| 3 | 0 | 1 | 0 | 2 | 2 | 2 |
| 4 | 0 | 1 | 1 | 2 | 2 | 3 |
| 5 | 0 | 0 | 0 | 1 | 1 | 1 |
| 6 | 0 | 0 | 1 | 1 | 3 | 3 |
| 7 | 0 | 1 | 0 | 1 | 2 | 2 |
| 8 | 0 | 1 | 1 | 1 | 2 | 3 |

METHOD AND SYSTEM FOR RESETTING A DIGITAL MODEL

BACKGROUND OF THE INVENTION

The invention relates to the general field of improving the performance of systems in which operation relies on using a digital model including at least one parameter that depends on a measurement taken by a sensor.

While taking a measurement, it happens frequently that such sensors suffer from a certain amount of inertia that is specific to each sensor and that depends in particular on the mass or on the size of the sensor. This inertia leads to an offset in time between the moment when the measurement is taken by the sensor and the moment when the sensor delivers signal in response to the measurement. This is also referred to as the "lag effect".

In order to mitigate that drawback, it is known to model the inertia of the sensor by using a filter having as its parameter a time constant that models the response time of the sensor, in other words its inertia.

Such methods, in particular as described in Document U.S. Pat. No. 5,080,496 make use of unchanging charts and they are difficult to apply, in particular when the time constant of the sensor depends on the environment in which it is being used or when the time constant of the sensor is likely to vary considerably from one sensor to another.

Document WO 2010/067009 presents a method of correcting a measurement signal delivered by a temperature sensor that enables the lag effect introduced by the sensor to be compensated, regardless of the time constant of the sensor.

That method makes use of a digital model for the temperature measured by the sensor. Nevertheless, errors in the model can lead to variation in the temperature during a mechanical transient being overestimated or underestimated for the period until the temperature measurement converges and stabilizes.

The invention seeks in particular to mitigate that drawback.

OBJECT AND SUMMARY OF THE INVENTION

To satisfy this need, the present invention proposes a method of resetting a basic digital model, the method comprising:
  a step of detecting a stable state of at least one first parameter of the model, the first parameter being representative of a signal delivered by a sensor;
  a step during the stable state of the first parameter performed to obtain a resetting parameter for the model as a function of the first parameter, of a second parameter of the model, and of the basic digital model; and
  a step of obtaining a reset model from the basic digital model and the resetting parameter.

Thus, and in general manner, the invention proposes a self-contained solution for automatically resetting a digital model on the measurement of the signal delivered by the sensor while the measurement is stable and is therefore no longer subject to error associated with lag.

In a particular implementation, resetting method of the invention comprises:
  a preliminary step of subdividing the domain of possible values for the second parameter into a plurality of ranges;
  a step of determining and storing the range in which the second parameter is to be found during the stabilized state of the first parameter;
  a step of calculating or of estimating a local resetting value and of allocating the local value to at least one of the ranges; and
  said resetting parameter being obtained from the local resetting values and the current value of said second parameter.

This particular implementation advantageously makes it possible for the basic digital model to be made discrete as a function of the second parameter by giving a single resetting value to each of the ranges defined by these discrete values, that single value covering the entire range.

In a particular implementation of the invention, the local resetting value allocated to one of the ranges is a value allocated to another one of the ranges, the other range being determined on the basis of a truth table.

This particular implementation serves to mitigate the situation in which local resetting values have not been allocated to all of the ranges.

In a particular implementation, the method of the invention, for at least one portion of the domain of possible values for the second parameter, includes a step of interpolating the resetting parameter from at least one of the local resetting values.

In this implementation, the accuracy of interpolation can easily be improved by increasing the number of the above-mentioned ranges.

In a particular implementation, the resetting method of the invention is implemented in a turbojet once and once only per flight and, after determining the range in which the second parameter is to be found, it comprises a step of storing in a non-volatile memory associated with the range, both the second parameter and the local resetting value.

This implementation enables the model to be reset automatically in a manner that is sufficiently frequent to correct the model of effects associated with drift over time, in particular as a result of the turbojet aging.

Storing the gain from one flight to another serves to guarantee optimized compensation as from the first transient.

In a particular implementation, the model is a gain relationship giving the ratio between two temperatures at two different stages of the turbojet as a function of a speed of rotation of a fan of the turbojet, the first parameter is one of said temperatures and the second parameter is said speed of rotation.

In this implementation, the present invention can improve the method described in Document WO 2010/067009.

In a particular implementation, the resetting method of the invention includes a step of calculating a corrected value for the first parameter on the basis of the current value of the first parameter and of the reset model.

In a particular implementation, the step of storing the range in which the second parameter is to be found is performed on condition of a positive result from a step of verifying that an engine of a turbojet is in the started state. This makes it possible to ensure that the measurement is accurate.

In a particular implementation, the resetting method of the invention includes a step of smoothing the resetting parameter.

Correspondingly, the invention provides a system for resetting a basic digital model, the system comprising:

a module for detecting a stable state of at least one first parameter of the model, the first parameter being representative of a signal delivered by a sensor;

a module for acting during the stable state of the first parameter to obtain a resetting parameter for the model as a function of the first parameter, of a second parameter of the model, and of the basic digital model; and a module for obtaining a reset model from the basic digital model and from the resetting parameter.

As mentioned above, because of its above-mentioned advantageous characteristics, the invention has a preferred but non-limiting application in the field of aviation and more particularly in the field of regulating and controlling aero-engines.

Thus, the invention also provides a turbojet including a system in accordance with the invention for resetting a basic digital model.

The invention also provides the use of a resetting method as mentioned above, wherein, in order to regulate the turbojet, use is made of the first parameter of the reset model, instead of the first parameter representative of the signal delivered by the sensor, the signal delivered by said sensor being used only for resetting the basic model and for obtaining the reset model.

BRIEF DESCRIPTION OF THE DRAWINGS

Other characteristics and advantages of the present invention appear from the following description made with reference to the accompanying drawings, which show an implementation having no limiting character.

In the figures.

DETAILED DESCRIPTION OF AN IMPLEMENTATION

There follows a description of a system and a method for resetting a basic digital model in accordance with a particular implementation of the invention.

In the presently-described example, the basic digital model that is to be reset is the model of a gain relationship for correcting a measurement signal T25 delivered by a sensor presenting thermal inertia and used for regulating an airplane turbojet. More precisely, and with reference to FIG. 1, the model serves to estimate a temperature ratio T25/T12 as a function of the speed of rotation PCN12R of a fan of the turbojet, where T12 represents the temperature at the inlet to the fan and T25 represents the temperature at the inlet to the high-pressure compressors of the turbojet.

In the presently-described implementation, the domain of possible values for the speed PCN12R (the second parameter in the meaning of the invention) is subdivided into three ranges PL1, PL2, and PL3. Choosing three ranges is not limiting, and the invention can be applied to any number of ranges.

In the presently-described implementation, the three ranges PL1, PL2, and PL3 for the speed of rotation PCN12R are the ranges [0, 40], [40, 80], and [80, . . . ].

Figure 1:
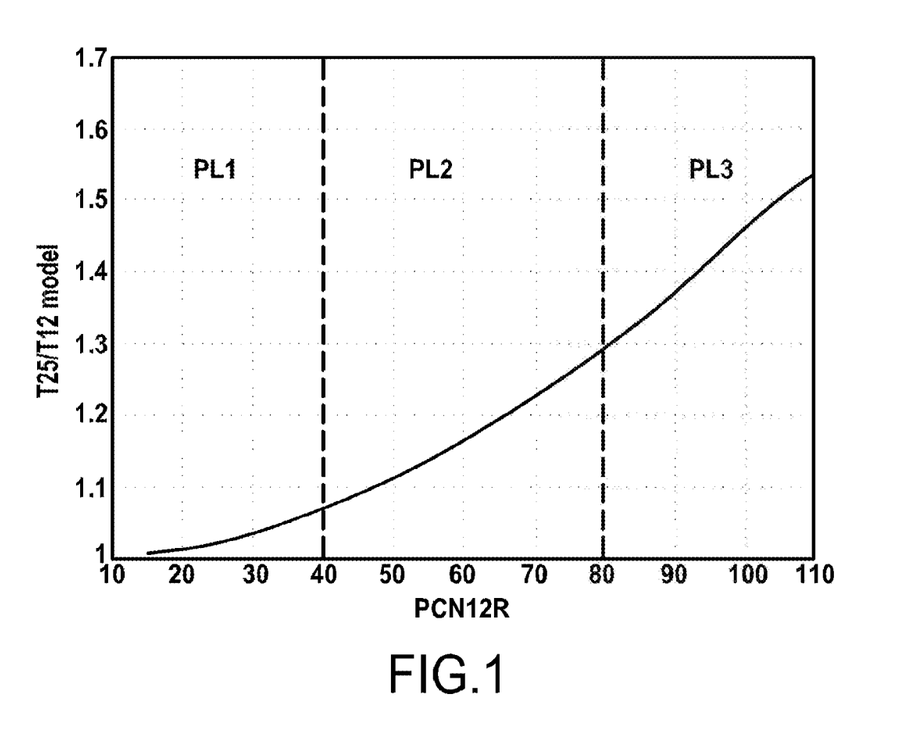
FIG. 1 is a diagram representing a digital model that can be reset by a system and a method in accordance with the invention.
Figure 2:
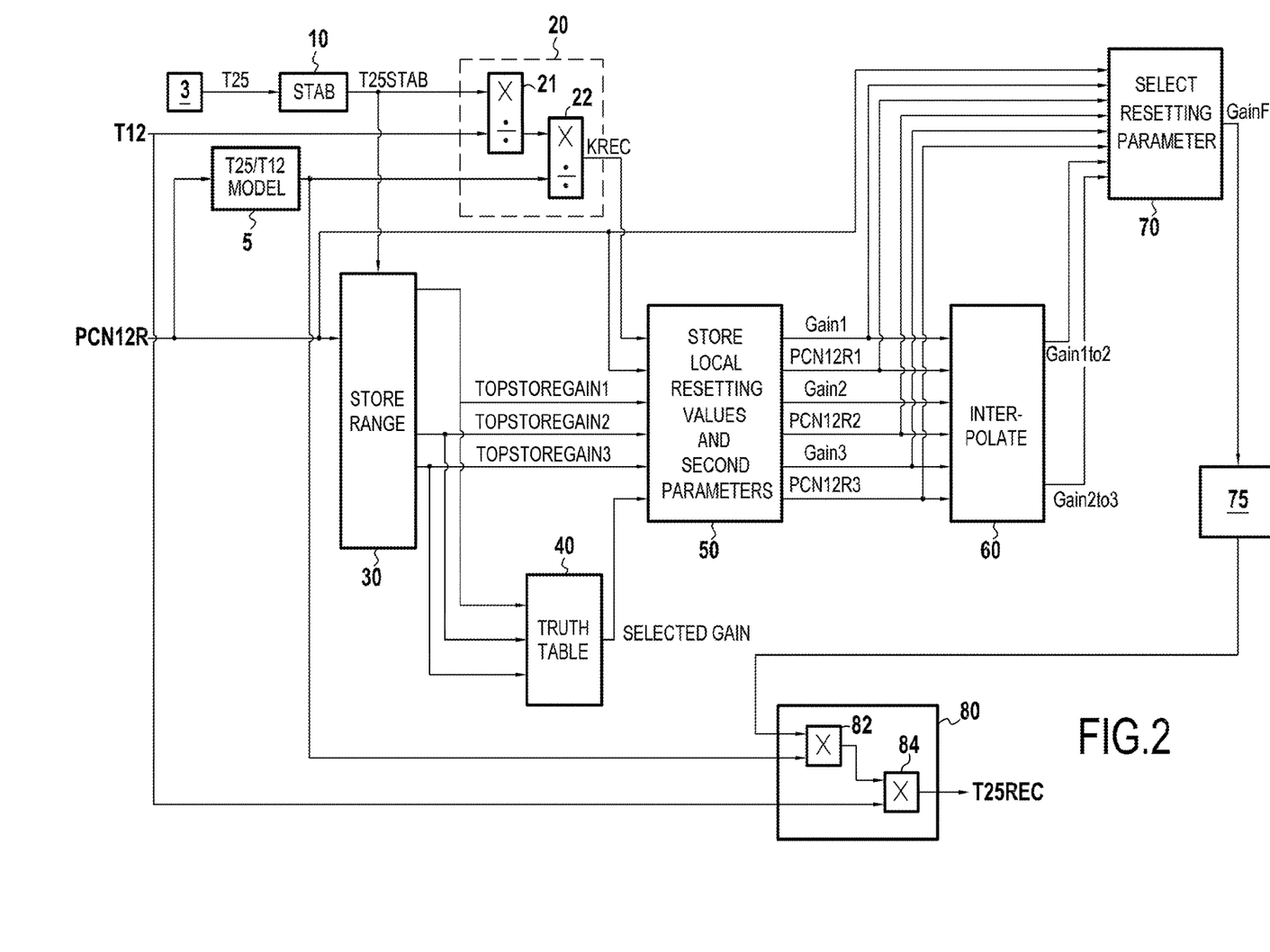
FIG. 2 is a diagram of a resetting system in a particular embodiment of the invention.
Figure 3:
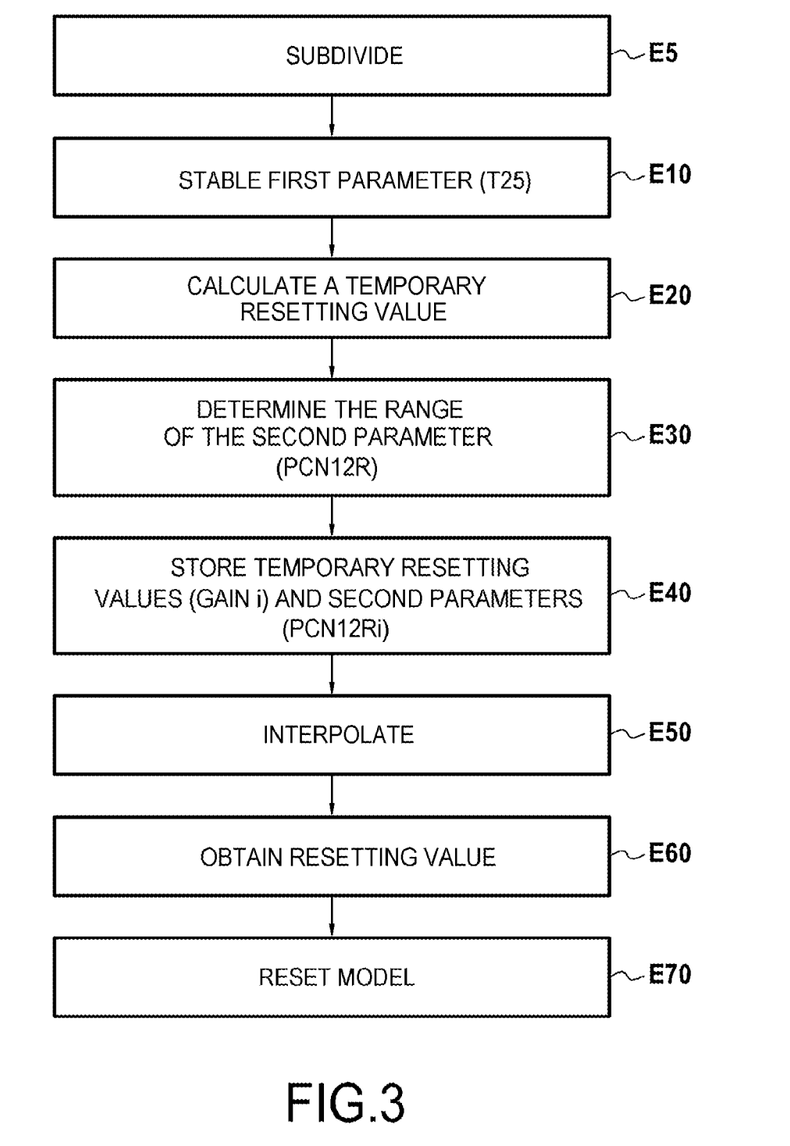
FIG. 3 is a flow chart showing the main steps of a resetting method in accordance with a particular implementation of the invention.

FIGS. 2 and 3 show respectively a resetting system and a resetting method suitable for resetting the basic digital model of FIG. 1.

The step E5 of subdividing the domain of possible values for the speed of rotation of the fan (the second parameter in the meaning of the invention) is a preliminary step that may be performed during a test stage, this step consisting mainly in selecting an appropriate number of ranges and the boundaries for these ranges.

In this implementation of the invention, the system 1 comprises in particular:

a sensor 3 for sensing the temperature T25;

a module 10 for detecting a stable state of a measurement of the signal delivered by the sensor (first parameter in the meaning of the invention);

a module 20 for calculating a local resetting value;

a module 30 for determining and storing the range in which the second parameter (speed of rotation of the fan) is to be found during the stabilized state of the first parameter (temperature T25);

a truth table 40;

a module 50 for storing a local resetting value and the current value of the second parameter for each of the ranges;

a module 60 for interpolating local resetting values;

a module 70 for selecting the resetting parameter from the local resetting values and from the current value of the second parameter; and a module 80 for correcting the basic module as a function of the resetting parameter.

In corresponding manner, the main steps of the resetting method shown in FIG. 3 are as follows:

a preliminary step E5 of subdividing the domain of possible values for the second parameter;

a step E10 of detecting a stable state of the temperature T25 (first parameter in the meaning of the invention);

a step E20 of calculating a local resetting value;

a step E30 of determining and storing the range in which the second parameter is to be found during the stabilized state of the first parameter;

a step E40 of storing the local resetting value and the current value of the second parameter for each of the ranges;

a step E50 of interpolating local resetting values;

a step E60 of obtaining the resetting parameter from the local resetting values and the current value of the second parameter; and a step E70 of obtaining the reset model from the basic digital model and the resetting parameter.

In the description below, consideration is given to signals and parameters that are sampled at a sampling period Te. This sampling period may be of the order of 20 milliseconds (ms) to 40 ms, for example.

It could nevertheless be observed that the invention can equally well be implemented with signals and parameters that are continuous.

Figure 4:
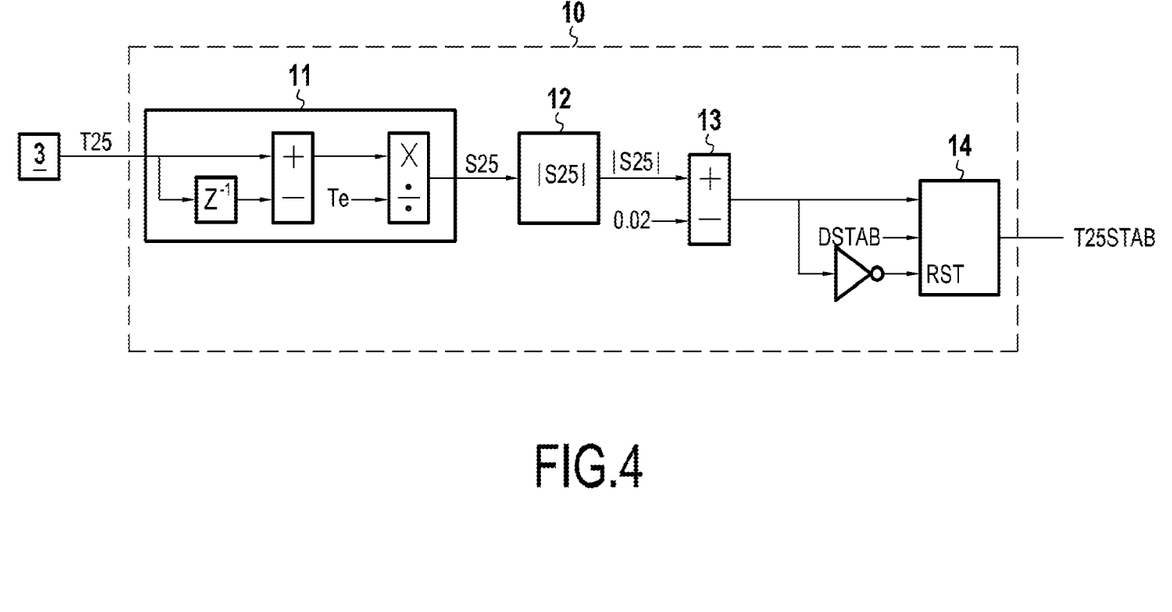
FIG. 4 is a diagram showing a module for detecting a stable state, suitable for use in the system of FIG. 2.

FIG. 4 shows a particular embodiment of the module 10 for detecting a stable state of the first parameter.

In the presently-described example, the module 10 receives as input the measurement signal T25 delivered to the sensor 3, and it delivers as output a signal T25STAB as soon as the measurement has been in a stable state for at least one predetermined stabilization duration DSTAB, e.g. of the order of 5 seconds (s).

In the presently-described particular embodiment, the module 10 comprises:
- a deriving module 11 that receives as input the measurement signal T25 and that supplies as output a signal S25 obtained by deriving the measurement signal T25. In the presently-described embodiment, the deriving module 11 comprises a delay cell delivering the measurement signal T25 at instant (n−1)·Te, a subtracter element for subtracting the delayed measurement signal T25[(n−1)·Te] from the measurement signal T25[nTe], the delayed measurement signal T25[(n−1)·Te] and a divider element adapted to divide the sum as obtained in this way by the sampling period Te. In this embodiment the differentiator module 11 is a filter of order 1. In a variant, the deriving module 11 could be a filter of higher order;
- a calculation module 12 suitable for evaluating the absolute value |S25| of the deriving signal S25;
- a comparator module 13 suitable for comparing the absolute value |S25| with a threshold close to 0, e.g. 0.02, in order to detect a stage of stability in the measurement; and
- a timer 14 for timing the predetermined stabilization duration DSTAB, which timer is reinitialized whenever the measurement is not in a stable stage.

With reference to FIG. 3, the system 1 of the invention includes a module 20 for calculating a local resetting value KREC.

In the presently-described embodiment, this module comprises:
- a first divider 21 suitable for evaluating the ratio T25/T12, when the temperature T25 at the inlet to the high-pressure compressor is stabilized; and
- a second divider 22 suitable for determining the local resetting value KREC from this ratio T25/T12 and a module 5 that implements the basic model as described above with reference to FIG. 1.

In the presently-described example, the resetting system and method of the invention associates this local resetting value KREC, which may be Gain1, Gain2, or Gain3 with at least one of the ranges PL1, PL2, PL3 defined during the preliminary subdividing step. When it is associated with a range $PL_i$, the local resetting value is also referenced $Gain_i$.

For this purpose, the method of the invention has a step E30 of determining and storing the range in which the second parameter is to be found during the stabilized state of the first parameter.

In corresponding manner, the system 1 has a module 30 for determining and storing the range in which the second parameter is to be found during the stabilized state of the first parameter.

Figure 5:
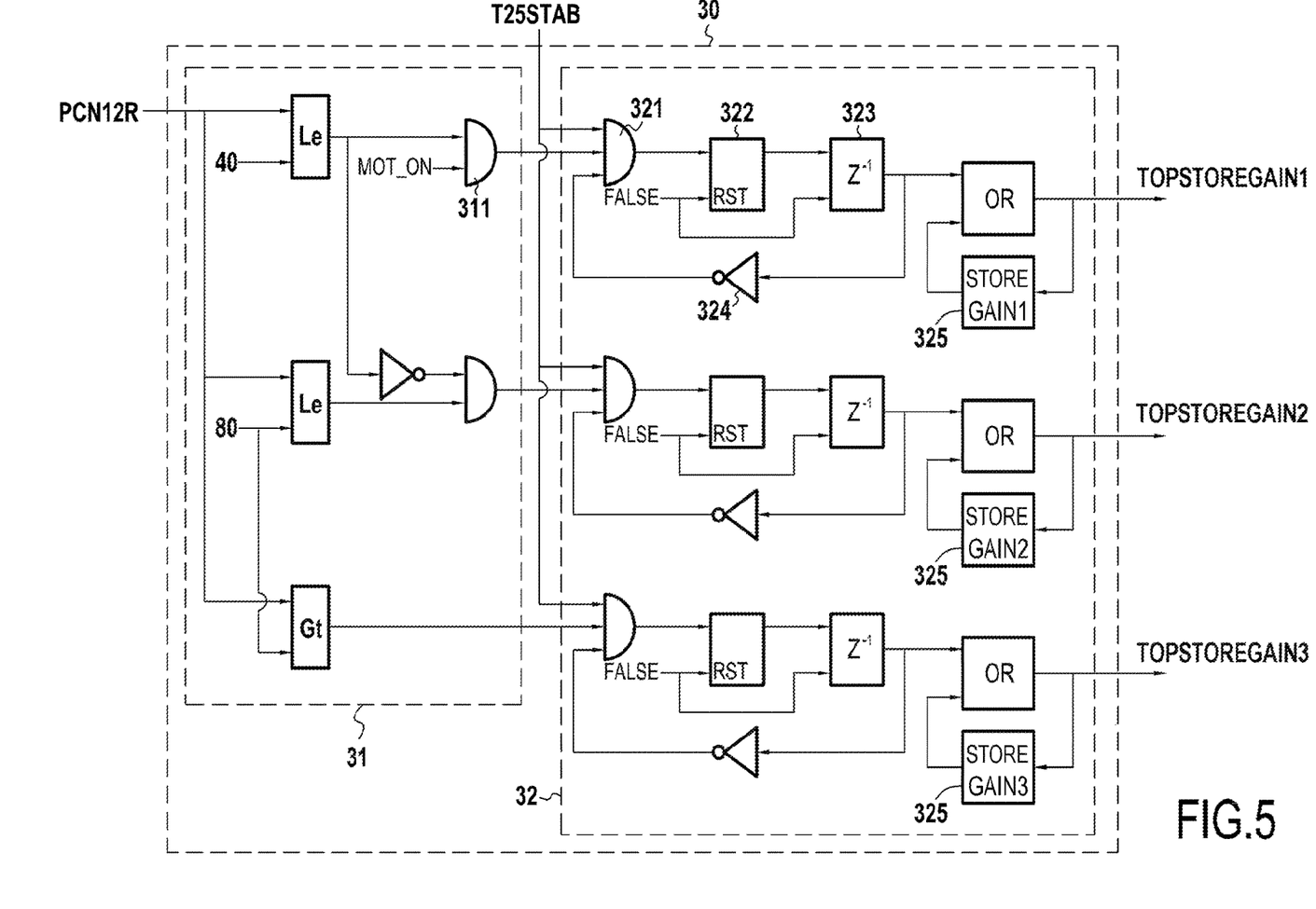
FIG. 5 is a diagram showing a module suitable for use in the FIG. 2 system for detecting and storing a range for the second parameter.

A particular embodiment of this module 30 is shown in FIG. 5.

In the presently-described embodiment, the module 30 receives as input a signal PCN12R representative of the speed of rotation of the fan (second parameter in the meaning of the invention), identifies a gain range in accordance with the model of FIG. 1, and stores this information in a non-volatile memory 325.

More precisely, the module 30 has a first stage 31 for determining the range in which the speed of rotation PCN12R of the fan is to be found from among the ranges PL1 to PL3 ([0, 40], [40, 80], and [80, . . . ]), and a second stage 32 serving to store a pair of information values (local resetting value, speed of rotation of the fan) in the non-volatile memory 325 for this range.

In remarkable manner, in this embodiment, the first AND gate of the first stage 31 takes as input a signal MOT_ON, with the TRUE value of this signal being representative of the fact that an engine of the turbojet has started. This additional condition for storing the gain range is verified in step E25 of the method of the invention. In a variant, other conditions could be taken into account.

In the presently-described example, the stage of identifying the gain range is performed on each flight cycle, once for each flight cycle. This characteristic, which serves to make resetting more robust, is implemented in the embodiment of FIG. 5 by interposing an inverter 324 between the output from the delay circuit 323 and an input of the AND logic gate 321.

In the presently-described embodiment, each time the engine is stopped, storage is reinitialized by the module 322 being initialized to FALSE.

Figure 6:
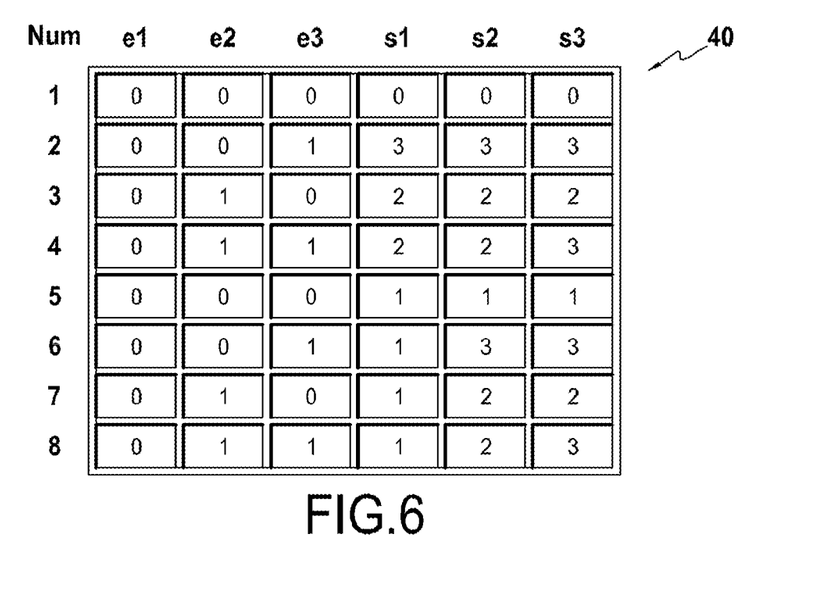
FIG. 6 is a truth table suitable for use in the FIG. 2 system.

In the presently-described embodiment, the system 1 of the invention includes a truth table 40, as shown in FIG. 6. This truth table serves to give a local resetting value KREC to a range that has not yet been identified.

For resetting, row 6 represents the situation in which local resetting values Gain1 and Gain3 have been allocated to the ranges PL1 and PL3 as a result of detecting a speed of rotation of the fan in each of those ranges, while no local value has been allocated in the range PL2. Under such circumstances, the gain Gain3 is allocated to the range PL2 (Gain2=Gain3). Normal operation is operation in which a local resetting value has been identified for each of the ranges (truth table 40, row 8).

The method of the invention includes a step E40 of storing the local resetting value $Gain_i$ and the value of the second parameter (written $PCN12R_i$) for each of the ranges $PL_i$.

In corresponding manner, the system 1 of the invention includes a module 50 for storing the local resetting value $Gain_i$, and the value of the second parameter (written $PCN12R_i$) for each of the ranges $PL_i$.

Figure 7:
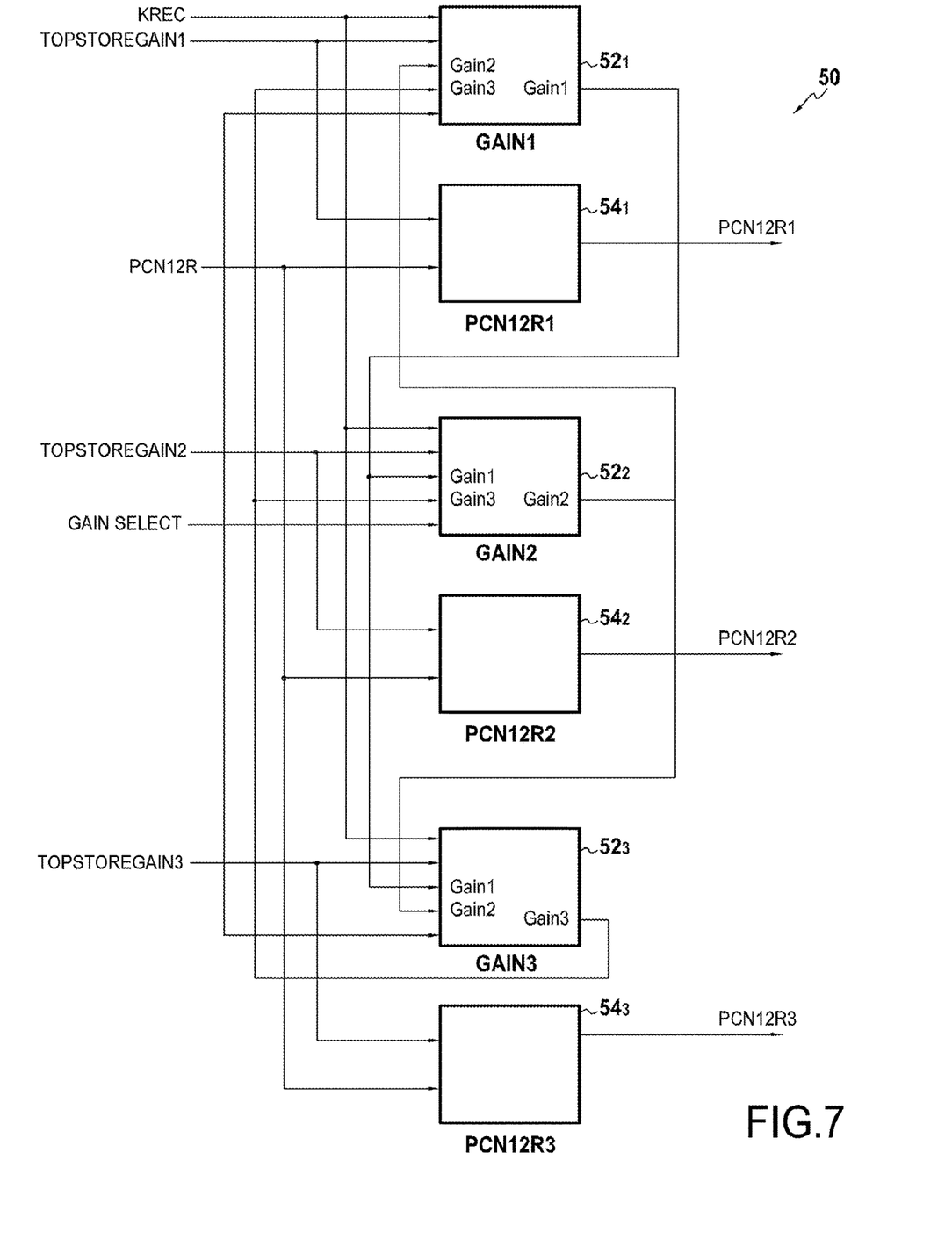
FIG. 7 is a diagram showing a module suitable for use in the FIG. 2 system for storing local resetting values.

FIG. 7 shows an implementation of this module. In this example, for each of the ranges $PL_i$ ([0, 40], [40, 80], and [80, . . . ]), use is made of a module $52_i$ for storing the local resetting value ($Gain_i$) and a module $54_i$ for storing the second parameter (speed of rotation of the fan $PCN12R_i$). Only those relating to the first range PL1 are described.

The module $52_1$ for storing the gain Gain1 and the module $52_1$ for storing the speed of rotation of the fan PCN12R1 receive as input the signal TOPSTOREGAIN1 representative of the fact that a speed of rotation of the fan PCN12R lying in the range PL1 ([0, 40]) has been detected by the module 40, the other conditions for storage (stable temperature T25, turbojet engine started, . . . ) being satisfied.

Under such conditions, the local resetting value KREC as calculated by the module 20 is allocated to the range PL1 (and is thus renamed Gain1) and it is stored in the module $52_1$. Likewise, the speed of rotation PCN12R is allocated to the range PL1 (and is thus renamed PCN12R1) and is stored in the module $54_1$.

As mentioned above, in the event that Gain1 has not been determined, the truth table 40 makes it possible to allocate the value of another gain to Gain1, e.g. Gain2 or Gain3. For this purpose, the outputs Gain2 and Gain3 from the modules $52_{2,3}$ for storing the gains Gain2 and Gain3 are redirected to the input of the module 52 for storing the gain Gain1.

At this stage of the method, a local resetting value ($Gain_i$) has thus been obtained for each of the ranges in association with a value for the second parameter ($PCN12R_i$, speed of rotation of the fan).

In the presently-described implementation and for at least one portion of the range of possible values for the second parameter PCN12R, the method of the invention includes a step E50 of interpolating the resetting parameter from one or more local resetting values.

In the same manner, in the presently-described embodiment, the system 1 of the invention includes a module 60 for obtaining the resetting parameter by interpolating local resetting values. In the presently-described example, the interpolation applied is more particularly linear interpolation between Gain1 and Gain2 if PCN12R lies in the range PCN12R1 to PCN12R2, and linear interpolation between Gain2 and Gain3 if PCN12R lies in the range PCN12R2 to PCN12R3.

This gives:

Gain1to2=Gain1+(Gain2−Gain1)(*PCN*12*R*−*PCN*12*R*1)/(*PCN*12*R*2−*PCN*12*R*1)

Gain2to3=Gain2+(Gain3−Gain2)(*PCN*12*R*−*PCN*12*R*2)/(*PCN*12*R*3−*PCN*12*R*2)

Figure 8:
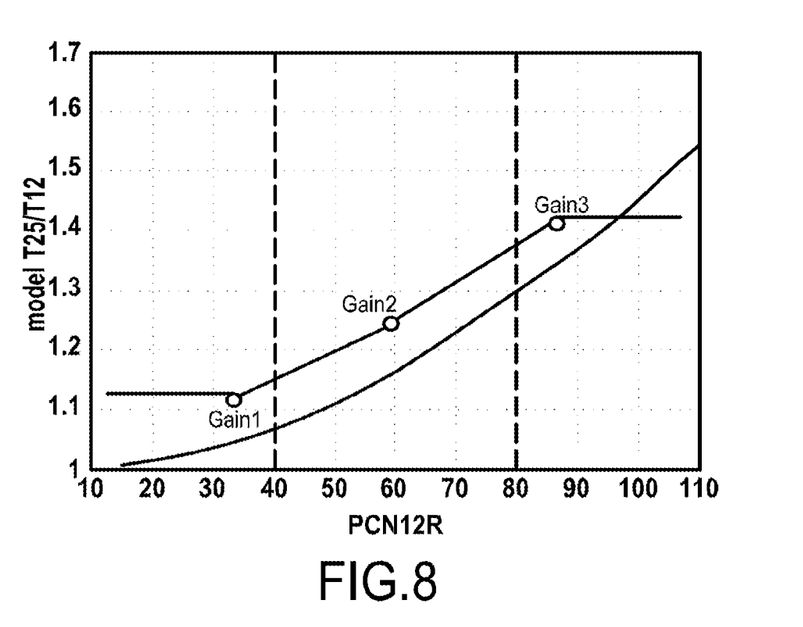
FIG. 8 shows the result of an interpolation step in a particular implementation of a method in accordance with the invention.

FIG. 8 shows the result of interpolation step E50 in a particular implementation of the method in accordance with the invention. In this particular implementation, use is also made of Gain1 for any speed of rotation of the fan that is slower than PCN12R1 and of Gain3 for any speed of rotation of the fan that is greater than PCN12R3.

The resetting parameter GainF is obtained (step E60) from the local resetting values Gain1, Gain2, Gain3 as a function of the current value of the second parameter PCN12R (speed of rotation of the fan).

Correspondingly, in the presently-described embodiment, the system 1 of the invention includes a module 70 for selecting the resetting parameter from local resetting values as a function of the current value of the second parameter PCN12R.

Figure 9:
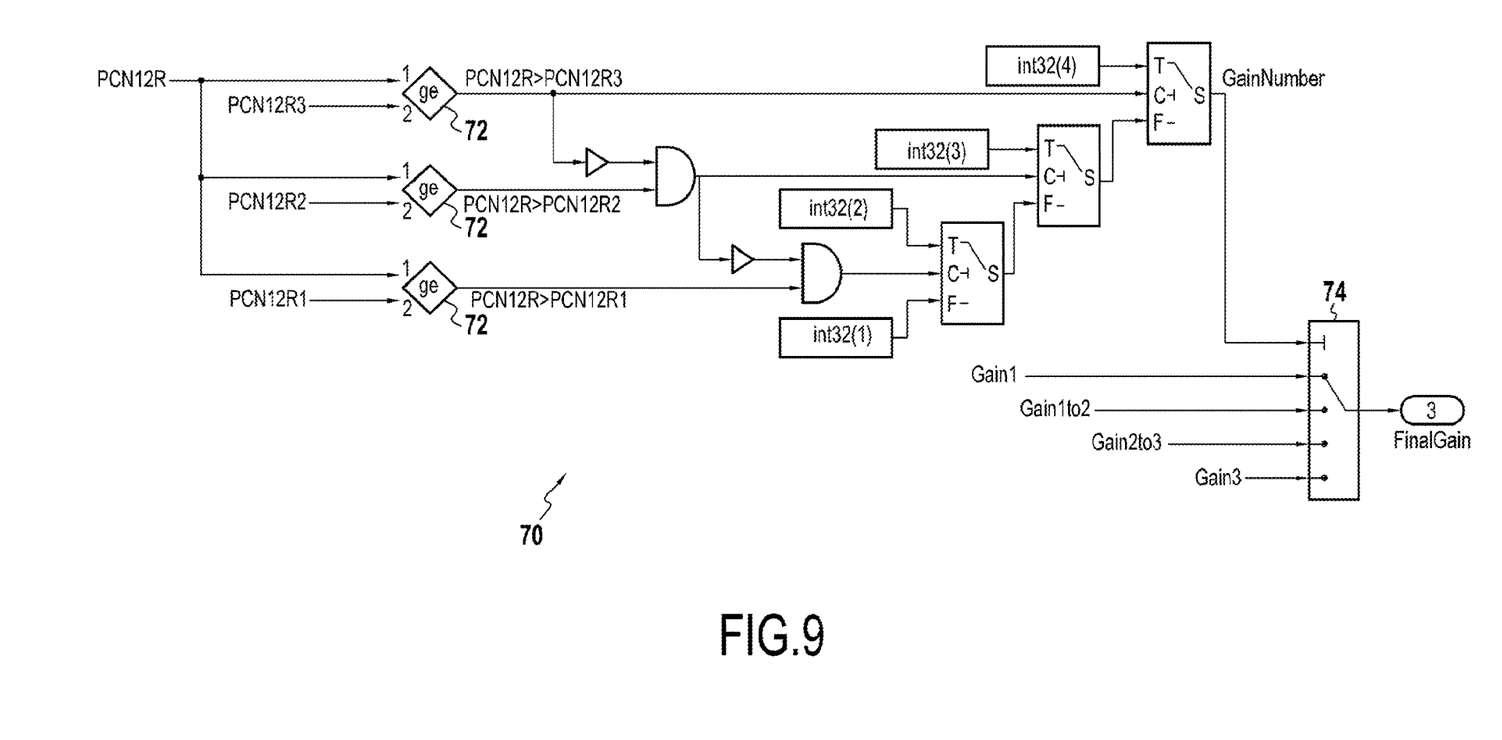
FIG. 9 is a diagram of a module for selecting a resetting parameter that is suitable for use in the FIG. 2 system.

FIG. 9 shows a particular embodiment of the module 70 for selecting the final gain GainF. This module has three comparators 72 suitable for comparing the speed of rotation of the fan PCN12R with the values PCN12R1, PCN12R2, and PCN12R3 corresponding to the three gain ranges and stored in the module 50.

A gain number GainNumber is then allocated as a function of the result of these comparisons:
GainNumber=4 if PCN12R>PCN12R3
GainNumber=3 if PCN12R3>PCN12R>PCN12R2
GainNumber=2 if PCN12R2>PCN12R>PCN12R1
GainNumber=1 if PCN12R1>PCN12R The gain selection module 70 finally includes a comparator 74 suitable for allocating the value Gain1, Gain1to2, Gain2to3, or Gain3 to the final gain GainF as a function of the gain number GainNumber.

The resetting method of the invention includes a step E70 of obtaining a model that has been reset from the basic digital model 5 and the resetting parameter GainF.

In corresponding manner, the system 1 of the invention includes a module 80 for correcting the basic model 5 as a function of the final gain GainF. In this embodiment, the module is constituted mainly by a multiplier 82.

In the presently-described embodiment, the module 80 also resets the temperature T25 on the basis of the current temperature T12 and of the reset model (multiplier 84). This produces a reset model T25REC for the temperature T25.

The reset model T25REC for the temperature is accurate and in a particular utilization of the invention it can be used instead of the temperature T25 as measured by the sensor. In this implementation, the sensor 3 is used in fact only during stabilized stages for resetting the model.

In the presently-described embodiment, the system 1 of the invention includes a gradient limiter that is interposed between the output of the gain selection module 70 and the input of the module 80 for correcting the basic model so as to smooth the transition from one gain to another.

In the presently-described implementation, the basic model shown in FIG. 1 is a one-dimensional model. The invention can be applied in the same manner for a model having a plurality of dimensions.

The invention claimed is:

1. A method of resetting a basic digital model, the method comprising:
    detecting a stable state of a first parameter of said basic digital model, the first parameter being representative of a signal delivered by a sensor, the basic digital model representing a relationship between the first parameter and a second parameter;
    during said stable state of said first parameter, obtaining a resetting parameter for said basic digital model as a function of said first parameter, of the second parameter of said basic digital model, and of said basic digital model;
    obtaining a reset model of the basic digital model based on the basic digital model and the resetting parameter; and
    regulating a turbojet using the reset model, wherein said basic digital model is a gain relationship giving a ratio between two temperatures at two different stages of the turbojet as a function of a speed of rotation of a fan of said turbojet,
    said first parameter is one of said temperatures, and said second parameter is said speed of rotation.

2. The method according to claim 1, further comprising:
    subdividing the domain of possible values for said second parameter into a plurality of ranges;
    determining and storing the range in which the second parameter is to be found during the stable state of the first parameter; and
    calculating or estimating a local resetting value and allocating said local resetting value to at least one of said ranges,
    wherein said resetting parameter is obtained from local resetting values allocated to at least one of said ranges and a current value of said second parameter.

3. The method according to claim 2, wherein said local resetting value allocated to one of said ranges is a value allocated to another one of said ranges, said other range being determined on the basis of a truth table.

4. The method according to claim 2, further comprising, for at least one portion of said domain of possible values, interpolating said resetting parameter from at least one of said local resetting values.

5. The method according to claim 2, further comprising:
    implementing said method in said turbojet once and once only per flight; and after determining the range in which the second parameter is to be found, storing in a non-volatile memory associated with said range, both said second parameter and said local resetting value.

6. The method according to claim 1, further comprising calculating a corrected value for said first parameter on the basis of a current value of the first parameter and of the reset model.

7. The method according to claim 5, wherein said storing of the range in which the second parameter is to be found is performed on condition of a positive result from verifying that an engine of a turbojet is in the started state.

8. The method according to claim 5, further comprising smoothing the resetting parameter.

9. A system for resetting a basic digital model, the system comprising:
 a detection circuit configured to detect a stable state of a first parameter of said basic digital model, the first parameter being representative of a signal delivered by a sensor, the basic digital model representing a relationship between the first parameter and a second parameter;
 a circuit configured, during said stable state of said first parameter, to obtain a resetting parameter for said basic digital model as a function of said first parameter, of the second parameter of said basic digital model, and of said basic digital model;
 a circuit configured to obtain a reset model of the basic digital model based on said basic digital model and from the resetting parameter; and
 a circuit configured to use the reset model, instead of the first parameter of the basic digital model, to regulate a turbojet, wherein
 said basic digital model is a gain relationship giving a ratio between two temperatures at two different stages of the turbojet as a function of a speed of rotation of a fan of said turbojet,
 said first parameter is one of said temperatures, and
 said second parameter is said speed of rotation.

10. The turbojet, comprising the system according to claim 9 for resetting the basic digital model.

11. The method according to claim 5, further comprising, in order to regulate said turbojet, using said first parameter of the reset model, instead of the first parameter representative of the signal delivered by the sensor, the signal delivered by said sensor being used only for resetting said basic digital model and for obtaining said reset model.

* * * * *